United States Patent
Oooka et al.

(10) Patent No.: US 10,236,336 B2
(45) Date of Patent: Mar. 19, 2019

(54) ORGANIC ELECTROLUMINESCENCE DISPLAY DEVICE WITH SPACERS

(71) Applicant: Japan Display Inc., Tokyo (JP)

(72) Inventors: Hiroshi Oooka, Tokyo (JP); Mitsuhide Miyamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/585,292

(22) Filed: May 3, 2017

(65) Prior Publication Data
US 2017/0236893 A1 Aug. 17, 2017

Related U.S. Application Data

(60) Division of application No. 15/171,754, filed on Jun. 2, 2016, now abandoned, which is a continuation of
(Continued)

(30) Foreign Application Priority Data

Mar. 22, 2013 (JP) ................................ 2013-060351

(51) Int. Cl.
*H01L 27/12* (2006.01)
*H01L 27/32* (2006.01)
*H01L 51/52* (2006.01)

(52) U.S. Cl.
CPC ........ *H01L 27/3279* (2013.01); *H01L 27/322* (2013.01); *H01L 27/3246* (2013.01);
(Continued)

(58) Field of Classification Search
CPC ............. H01L 27/3246; H01L 27/3248; H01L 27/3258; H01L 27/3276; H01L 27/3281;
(Continued)

(56) References Cited

U.S. PATENT DOCUMENTS 6,630,785 B1 * 10/2003 Lu ...................... H01L 27/3283
313/498
8,309,976 B2 * 11/2012 Yamazaki ........... H01L 27/3244
257/40
(Continued)

FOREIGN PATENT DOCUMENTS

JP 2002-033198 A 1/2002
JP 2003-92192 A 3/2003
(Continued)

OTHER PUBLICATIONS

Japanese Office Action dated May 31, 2016, for corresponding Japanese Application No. 2013-060351. With partial English Translation.

*Primary Examiner* — Mohsen Ahmadi
(74) *Attorney, Agent, or Firm* — Typha IP LLC

(57) ABSTRACT

Provided is an organic electroluminescence display device. The organic electroluminescence display device includes a bank that is provided so as to surround a central portion of a pixel electrode, an organic electroluminescence layer that is provided on the pixel electrode, a common electrode that is formed so as to extend from the organic electroluminescence layer to the bank, a color filter layer that overlaps the organic electro luminescence layer, a black matrix layer that overlaps the bank, a spacer that is provided on the black matrix layer, and a wiring that is provided on the black matrix layer so as to be placed on the spacer. The black matrix layer is disposed on the bank through the spacer. A convex portion is formed by the wiring being placed on the spacer, and the convex portion is electrically connected to the common electrode above the bank.

7 Claims, 3 Drawing Sheets

Related U.S. Application Data application No. 14/800,031, filed on Jul. 15, 2015, now Pat. No. 9,397,148, which is a continuation of application No. 14/207,765, filed on Mar. 13, 2014, now Pat. No. 9,231,036.

(52) U.S. Cl.
CPC ...... H01L 27/3248 (2013.01); H01L 27/3262 (2013.01); H01L 27/3276 (2013.01); H01L 51/5203 (2013.01); H01L 51/525 (2013.01); H01L 51/5284 (2013.01); H01L 27/124 (2013.01); H01L 27/3274 (2013.01); H01L 27/3283 (2013.01); H01L 27/3295 (2013.01); H01L 51/5206 (2013.01); H01L 51/5218 (2013.01); H01L 2227/323 (2013.01); H01L 2251/5315 (2013.01)

(58) Field of Classification Search
CPC ............... H01L 27/3295; H01L 51/525; H01L 27/3283; H01L 27/3274; H01L 27/3209; H01L 27/3211–27/3218; H01L 51/5206–51/5218; H01L 51/5221–51/5234

See application file for complete search history.

(56) References Cited

U.S. PATENT DOCUMENTS

| | | | |
|---|---|---|---|
| 2001/0011868 A1* | 8/2001 | Fukunaga | H01L 27/1214 313/506 |
| 2001/0043046 A1 | 11/2001 | Fukunaga | |
| 2003/0122140 A1* | 7/2003 | Yamazaki | H01L 21/67207 257/88 |
| 2005/0001963 A1* | 1/2005 | Yokoyama | G02F 1/133555 349/122 |
| 2005/0073243 A1* | 4/2005 | Yamazaki | H01L 27/3246 313/498 |
| 2005/0136578 A1* | 6/2005 | Ohtani | G02B 27/017 438/179 |
| 2005/0212413 A1 | 9/2005 | Matsuura et al. | |
| 2006/0279491 A1 | 12/2006 | Ozawa et al. | |
| 2007/0241664 A1* | 10/2007 | Sakamoto | H01L 27/3276 313/503 |
| 2007/0273305 A1 | 11/2007 | Kubota | |
| 2010/0171769 A1 | 7/2010 | Kamio et al. | |
| 2011/0242476 A1* | 10/2011 | Moriwaki | G02F 1/13394 349/153 |
| 2011/0279014 A1 | 11/2011 | Winters et al. | |
| 2012/0120119 A1 | 5/2012 | Park et al. | |
| 2013/0134398 A1 | 5/2013 | Yamazaki et al. | |
| 2014/0035456 A1* | 2/2014 | Isa | H01L 27/3211 313/498 |
| 2014/0138716 A1* | 5/2014 | Satou | H01L 27/15 257/88 |
| 2014/0225078 A1* | 8/2014 | Jeung | H01L 27/3209 257/40 |
| 2014/0246654 A1* | 9/2014 | Huang | H01L 27/326 257/40 |
| 2014/0284590 A1 | 9/2014 | Nakazawa et al. | |
| 2014/0367669 A1 | 12/2014 | Takeuchi et al. | |
| 2015/0212540 A1* | 7/2015 | Tsujimoto | G02F 1/13338 345/174 |

FOREIGN PATENT DOCUMENTS

| | | |
|---|---|---|
| JP | 2006-278241 A | 10/2006 |
| JP | 2007-265756 A | 10/2007 |
| JP | 2009-128671 A | 6/2009 |
| WO | 2013/062059 A1 | 5/2013 |

* cited by examiner

ORGANIC ELECTROLUMINESCENCE DISPLAY DEVICE WITH SPACERS

CROSS-REFERENCE TO RELATED APPLICATIONS

This application is a division of U.S. patent application Ser. No. 15/171,754, filed on Jun. 2, 2016, which, in turn, is a continuation of U.S. patent application Ser. No. 14/800,031, filed on Jul. 15, 2015 (now U.S. Pat. No. 9,397,148), which, in turn, is a continuation of U.S. patent application Ser. No. 14/207,765, filed on Mar. 13, 2014 (now U.S. Pat. No. 9,231,036), which claims priority from Japanese Patent Application No. 2013-060351 filed on Mar. 22, 2013 with the Japanese Patent Office, the entire contents of which are incorporated herein by reference.

BACKGROUND OF THE INVENTION

1. Field of the Invention

The present invention relates to an organic electroluminescence display device.

2. Description of the Related Art

In top-emission type organic electroluminescence display devices, light is extracted from a negative electrode, and thus the negative electrode is required to be high in light transmittance from the perspective of improvement of light extraction efficiency. Meanwhile, a negative electrode is also required to be high in conductivity from the perspective of low power consumption.

Transparent oxide semiconductor films are generally used as negative electrodes, but an increase in thickness of the transparent oxide semiconductor film is essential to reduce sheet resistance, and transmittance is reduced. Light transmittance and conductivity have a trade-off relationship with each other, and thus it is difficult to satisfy both of them.

When a combination of a transparent oxide semiconductor film and a metal thin film having high conductivity is used, the influence of a light interference effect by the reflection of a metal thin film is great, and thus it becomes difficult to adjust a luminescent color.

When a metal film having high conductivity is formed in a non-emission region, a pixel aperture is not reduced in size, but a higher film formation accuracy than that of the pixel aperture is required, and thus application in production is difficult. For example, it is possible to form a minute auxiliary wiring on a transparent conductive film by deposition using a shadow mask, but a film formation region becomes narrower than a pixel. Thus, a highly accurate mask manufacturing technique and film formation technique are required, which results in a difficulty in practical application.

JP 2002-33198 A or JP 2006-278241 A discloses that an organic layer and a negative electrode are formed on a thin film transistor (TFT) substrate, an adhesion layer is formed on an encapsulation substrate for encapsulating the organic layer, an auxiliary wiring is formed on the adhesion layer, and the encapsulation substrate is bonded to the TFT substrate so that the auxiliary wiring faces a negative electrode. Meanwhile, the auxiliary wiring is pushed into the adhesion layer, and thus the auxiliary wiring and the negative electrode come into contact with each other. In this example, since the auxiliary wiring is formed on the adhesion layer, there is a problem in that a material is limited for a reason that the formation has to be performed without thermal curing.

JP 2009-128671 A discloses that a transparent conductive film is formed on an encapsulation substrate, and the encapsulation substrate is bonded to a TFT substrate, thereby bringing the transparent conductive film into contact with a negative electrode on the TFT substrate. However, since the transparent conductive film covers an emission region, a decrease in light transmittance is inevitable.

SUMMARY OF THE INVENTION

An object of the present invention is to satisfy both high light transmittance and high conductivity.

(1) An organic electroluminescence display device according to the present invention includes a plurality of pixel electrodes; a bank that is provided so as to surround at least a central portion of each of the pixel electrodes; an organic electroluminescence layer that is provided on the plurality of pixel electrodes; a common electrode which has light transmittance and is formed so as to extend from the organic electroluminescence layer to the bank; a black matrix layer that overlaps the bank; a spacer that is provided on the black matrix layer; and a wiring that is provided on the black matrix layer, a part of the wiring being placed on the spacer. The black matrix layer is disposed on the bank through the spacer. The wiring has a convex portion formed by the part of the wiring being placed on the spacer, and the convex portion is electrically connected to the common electrode above the bank. According to the present invention, the entire conductivity of the wiring and the common electrode which are electrically connected to each other is higher than the conductivity of the common electrode. In addition, since the wiring is formed so as to overlap the black matrix layer, the wiring does not interfere with light transmission. Therefore, it is possible to satisfy both high light transmittance and high conductivity.

(2) The organic electroluminescence display device according to (1) may further include an insulating layer that is present below the plurality of pixel electrodes; a plurality of thin film transistors that are present below the insulating layer; and a contact that passes through the insulating layer below the bank to electrically connect each of the pixel electrodes to each of the thin film transistors. The plurality of pixel electrodes may include a group constituted by two or more of the pixel electrodes that are adjacent to each other. The contacts included in the pixel electrodes of the group may be disposed so as to be adjacent to each other. The bank may have a coating portion that continuously covers two or more of the contacts. The spacer may be located on the coating portion. The convex portion of the wiring may be electrically connected to the common electrode above the coating portion.

(3) In the organic electroluminescence display device according to (2), the group may be constituted by four of the pixel electrodes, and the contacts included in the four of the pixel electrodes may be disposed so as to surround the spacer when seen in a plan view.

(4) The organic electroluminescence display device according to (2) may further include a first substrate, and a second substrate facing the first substrate. The organic electroluminescence layer, the plurality of pixel electrodes, the common electrode, the bank, and the plurality of thin film transistors may be formed in the first substrate. The black matrix layer, the spacer, and the wiring may be formed in the second substrate.

(5) In the organic electroluminescence display device according to (1), the organic electroluminescence layer may be configured to emit white light.

(6) The organic electroluminescence display device according to (1) may further include a color filter layer overlapping the organic electroluminescence layer.

(7) In the organic electroluminescence display device according to (6), a space may be formed between the organic electroluminescence layer and the color filter layer.

(8) The organic electroluminescence display device according to (1) may further include a first substrate, and a second substrate facing the first substrate. The organic electroluminescence layer, the plurality of pixel electrodes, the common electrode, and the bank may be formed in the first substrate. The black matrix layer, the spacer, and the wiring may be formed in the second substrate.

DETAILED DESCRIPTION OF THE INVENTION

Hereinafter, an embodiment of the present invention will be described with reference to the accompanying drawings.

Figure 1:
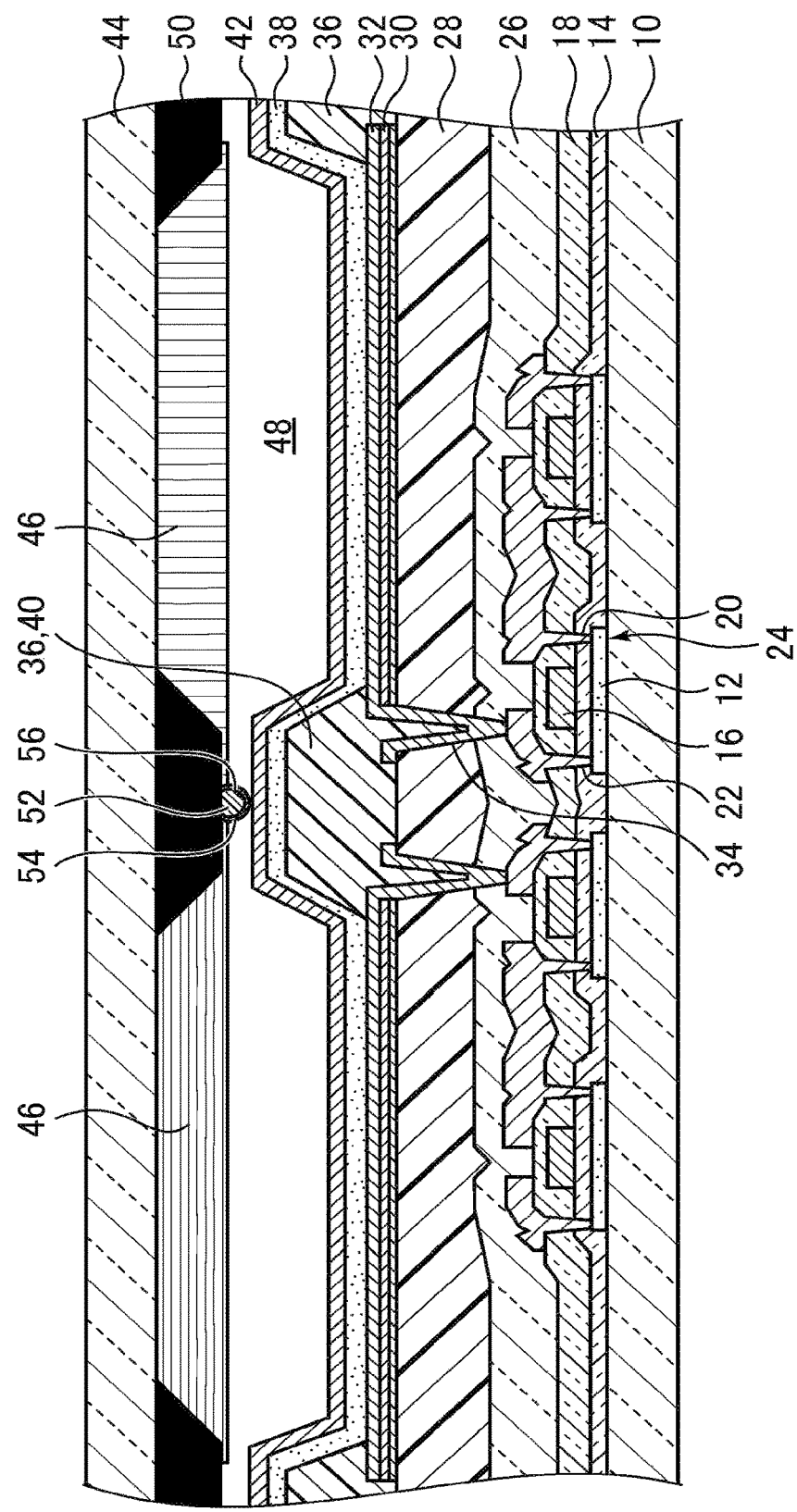
FIG. 1 is a cross-sectional view of an organic electroluminescence display device according to an embodiment of the present invention.

FIG. 1 is a plan view of an organic electroluminescence display device according to an embodiment of the present invention. The organic electroluminescence display device includes a first substrate 10 which has light transmittance and is formed of glass or the like. A semiconductor layer 12 is formed on the first substrate 10. A gate insulating film 14 is formed so as to cover the semiconductor layer 12. A gate electrode 16 is formed on the gate insulating film 14, and an interlayer insulating film 18 is formed so as to cover the gate electrode 16. A source electrode 20 and a drain electrode 22 are provided so as to pass through the interlayer insulating film 18 to reach the semiconductor layer 12. The semiconductor layer 12, the source electrode 20, the drain electrode 22, and the gate electrode 16 are components of a thin film transistor 24.

A passivation film 26 is formed on the interlayer insulating film 18 so as to cover the source electrode 20 and the drain electrode 22, and an insulating layer 28 is provided thereon. A light reflection layer 30 for reflecting light is formed on the insulating layer 28.

A pixel electrode 32 (for example, a positive electrode) is provided on the light reflection layer 30. The pixel electrode 32 passes through the insulating layer 28 to be electrically connected to one of the source electrode 20 and the drain electrode 22. The insulating layer 28 is present below the plurality of pixel electrodes 32, and the plurality of thin film transistors 24 are present below the insulating layer 28.

Figure 2:
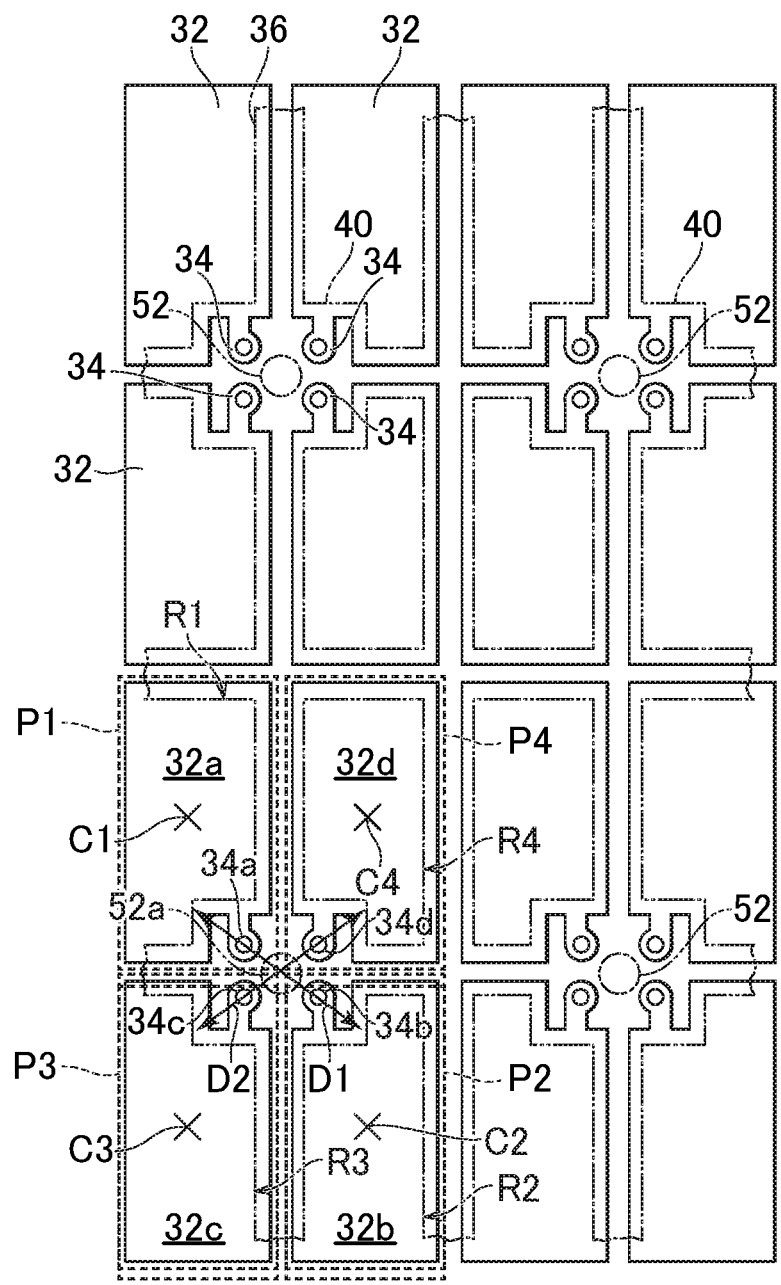
FIG. 2 is a diagram illustrating a pixel electrode.

FIG. 2 is a diagram illustrating the pixel electrode 32. The organic electroluminescence display device has the plurality of pixel electrodes 32 which are separated from each other. Each of the pixel electrodes 32 is electrically connected to any one of the thin film transistors 24 by a contact 34 passing through the insulating layer 28. The contacts 34a, 34b, 34c, and 34d, included in the respective adjacent pixel electrodes 32a, 32b, 32c, and 32d arranged in the directions D1 and D2, are disposed so as to be adjacent to each other. In other words, the plurality of contacts 34a, 34b, 34c, and 34d are gathered in one place.

The organic electroluminescence display device includes a first pixel P1, a second pixel P2, a third pixel P3, and a fourth pixel P4. The first pixel P1 includes a first light emitting region R1, the second pixel P2 includes a second light emitting region R2, the third pixel P3 includes a third light emitting region R3, and the fourth pixel P4 includes a fourth light emitting region R4. The first light emitting region R1 has a first center portion C1, the second light emitting region R2 has a second center portion C2, the third light emitting region R3 has a third center portion C3, and the fourth light emitting region R4 has a fourth center portion C4.

A bank 36 formed of an insulator such as a resin is provided so as to surround at least a central portion of each of the pixel electrodes 32. As illustrated in FIG. 1, an organic electroluminescence layer 38 is formed on the pixel electrodes 32 surrounded by the bank 36. A portion of the organic electroluminescence layer 38 is also placed on the bank 36. As illustrated in FIG. 2, the bank 36 has a coating portion 40 that continuously covers two or more adjacent contacts 34.

The organic electroluminescence layer 38 includes at least a light emitting layer, and further includes at least one of an electron transport layer, a hole transport layer, an electron injection layer, and a hole injection layer. At least one layer constituting the organic electroluminescence layer 38 is formed of an organic material. The organic electroluminescence layer 38 is formed by deposition or sputtering. The organic electroluminescence layer 38 is configured so as to emit white light through color mixture by superimposing a plurality of light emitting layers emitting different colors.

A common electrode 42 having light transmittance is formed so as to extend from the organic electroluminescence layer 38 to the bank 36. The common electrode 42 is formed so as to cover all the pixel electrodes 32. The organic electroluminescence layer 38 is disposed between the pixel electrode 32 and the common electrode 42. A voltage is applied to the pixel electrode 32 and the common electrode 42 to inject holes and electrons into the organic electroluminescence layer 38 from the pixel electrode and the common electrode, respectively. The injected holes and electrons are coupled to each other in the light emitting layer to emit light.

The organic electroluminescence display device includes a second substrate 44 which has light transmittance and is formed of glass or the like. The second substrate 44 is disposed so as to face the first substrate 10 at an interval. A color filter layer 46 is provided on a surface of the second substrate 44 on the first substrate 10 side. The color filter layer 46 overlaps the organic electroluminescence layer 38. A space 48 is formed between the organic electroluminescence layer 38 and the color filter layer 46. In other words, hollow sealing is applied. As a modified example, the space 48 may be filled with a resin. A black matrix layer 50 is formed on a surface of the second substrate 44 on the first substrate 10 side.

Figure 3:
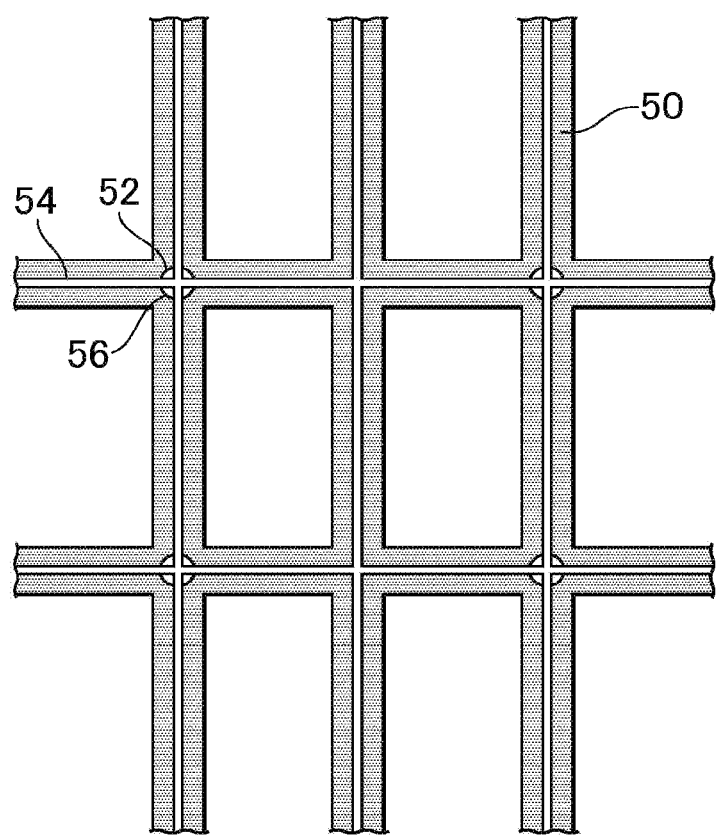
FIG. 3 is a diagram illustrating a black matrix layer.

FIG. 3 is a diagram illustrating the black matrix layer 50. A spacer 52 is provided on the black matrix layer 50. A wiring 54 is provided on the black matrix layer 50 so as to be placed on the spacer 52. By the wiring 54 being placed on the spacer 52, a convex portion 56 is formed. Since the wiring 54 is formed on the black matrix layer 50 on the second substrate 44, a photo process or a baking process can be applied, and there is a wide range of choices for a material.

A manufacturing process includes forming the black matrix layer 50 on one surface of the second substrate 44, forming the black matrix layer 50 on the same surface, providing the spacer 52 on the black matrix layer 50 on the same side, and forming the wiring 54, in this order.

As illustrated in FIG. 1 and FIG. 2, the black matrix layer 50 overlaps the bank 36. The black matrix layer 50 is disposed on the bank 36 through the spacer 52. By the presence of the spacer 52, a gap is formed between the black matrix layer 50 and the bank 36, but the size of the gap is uniformized. In addition, by the presence of the spacer 52, the gap is increased in size in spite of the presence of external substances between the organic electroluminescence layer 38 and the color filter layer 46, and thus the organic electroluminescence layer 38 is not crushed.

The convex portion 56 of the wiring 54 is electrically connected to the common electrode 42 above the bank 36. By the presence of the convex portion 56, the wiring 54 and the common electrode 42 can stably come into contact with each other. As a modified example, when the space 48 illustrated in FIG. 1 is filled with a resin, even if an upper surface of the common electrode 42 is covered by the resin, the convex portion 56 is pushed into the resin to be brought into contact with the common electrode 42. As shown in FIG. 2, the coating portion 40 of the bank 36 is large in width as the coating portion continuously covers two or more contacts 34a, 34b, 34c, and 34d, and thus the spacer 52a is located thereon. The convex portion 56 of the wiring 54 is electrically connected to the common electrode 42 above the coating portion 40.

According to this embodiment, the entire conductivity of the wiring 54 and the common electrode 42 that are electrically connected to each other is higher than the conductivity of the common electrode 42. In addition, since the wiring 54 is formed so as to overlap the black matrix layer 50 and not to protrude, the wiring does not interfere with light transmission. Therefore, it is possible to satisfy both high light transmittance and high conductivity.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device comprising:
   a plurality of pixels including a first pixel, a second pixel, a third pixel, and a fourth pixel, the first pixel including a first pixel electrode and a first thin film transistor, the first and second pixels arranged in a first direction, the third and fourth pixels arranged in a second direction which intersects the first direction, and the first to fourth pixels being adjacent to one another;
   a bank partitioning the plurality of pixels;
   a common electrode located above at least the first pixel electrode;
   an organic electroluminescence layer located at least between the first pixel electrode and the common electrode; and
   a plurality of spacers overlapping with the bank in a planar view,
   wherein the first pixel electrode is connected with the first thin film transistor via a first contact hole,
   the first pixel includes a first light emitting region,
   the second pixel includes a second light emitting region,
   the third pixel includes a third light emitting region,
   the fourth pixel includes a fourth light emitting region,
   one of the spacers is located between the first and second light emitting regions,
   the first light emitting region has a first corner,
   the second light emitting region has a second corner facing the first corner in the first direction,
   the third light emitting region has a third corner,
   the fourth light emitting region has a fourth corner facing the third corner in the second direction,
   the one of the spacers overlaps with an area surrounded by the first to fourth light emitting regions in a planar view, and
   the one of the spacers is located in a region surrounded by the first to fourth corners in a planar view.

2. The organic electroluminescence display device according to claim 1, wherein the common electrode, the bank, and the one of the spacers are stacked.

3. The organic electroluminescence display device according to claim 1, wherein the spacers are not located at all boundary areas between the pixels in a planar view.

4. The organic electroluminescence display device according to claim 1, wherein the first contact hole and the one of the spacers are arranged in the first direction.

5. The organic electroluminescence display device according to claim 1, wherein the first to fourth pixels are arranged in two columns and two rows.

6. The organic electroluminescence display device according to claim 1, wherein the first light emitting region has a first center portion therein,
   the second light emitting region has a second center portion therein,
   the third light emitting region has a third center portion therein,
   the fourth light emitting region has a fourth center portion therein,
   the first to fourth center portions are inside the first to fourth light emitting regions, respectively, and
   the one of the spacers is located in a region surrounded by the first to fourth center portions in a planar view.

7. The organic electroluminescence display device according to claim 1, wherein the one of the spacers overlaps with a center of the region in a planar view.

* * * * *